United States Patent [19]

Cheung et al.

[11] Patent Number: 4,727,045
[45] Date of Patent: Feb. 23, 1988

[54] PLUGGED POLY SILICON RESISTOR LOAD FOR STATIC RANDOM ACCESS MEMORY CELLS

[75] Inventors: Robin W. Cheung, Cupertino; Hugo W. K. Chan, Fremont, both of Calif.

[73] Assignee: Advanced Micro Devices, Inc., Sunnyvale, Calif.

[21] Appl. No.: 891,820

[22] Filed: Jul. 30, 1986

[51] Int. Cl.[4] .................. H01L 21/82; H01L 21/90
[52] U.S. Cl. ........................... 437/47; 437/57; 437/60; 437/190; 437/192; 437/193; 357/59; 148/DIG. 136
[58] Field of Search ............ 357/59 K, 59 F; 148/DIG. 136; 437/46, 47, 57, 60, 190, 192, 193

[56] References Cited

U.S. PATENT DOCUMENTS

| | | | |
|---|---|---|---|
| 4,210,465 | 7/1980 | Brower | 148/1.5 |
| 4,271,424 | 6/1981 | Inayoshi et al. | 357/67 |
| 4,292,730 | 10/1981 | Ports | 29/577 C |
| 4,416,049 | 11/1983 | McElroy | 29/571 |
| 4,640,004 | 2/1987 | Thomas et al. | 29/590 |

Primary Examiner—Olik Chaudhuri
Attorney, Agent, or Firm—Patrick T. King; David W. Collins

[57] ABSTRACT

An improved process for fabricating a static RAM cell having a polysilicon load resistance is provided. Following formation of source, gate and drain regions, a planarized dielectric structure is formed over the junction regions, and via openings which expose portions of the source and drain regions are created. The via openings are filled with polysilicon interconnects, appropriately doped for low resistance contacts. Where the contact includes a resistor load, the polysilicon is not doped. Thus, the prior art approach of providing doped and undoped regions along the same polysilicon interconnect is not employed. Rather, the doped and undoped regions are physically separated. Consequently, the minimum length of the poly load is limited only by the ability to form via openings of small dimensions.

14 Claims, 6 Drawing Figures

PLUGGED POLY SILICON RESISTOR LOAD FOR STATIC RANDOM ACCESS MEMORY CELLS

BACKGROUND OF THE INVENTION

1. Field of the Invention

The present invention relates to static random access memory (SRAM) devices with resistor loads, and, more particularly, to an improved method for forming the polysilicon resistor load (poly load) which is scalable to smaller dimensions.

2. Description of the Related Art

SRAMs with resistor loads employ polysilicon as the resistance material, since by ion implantation, its resistance can be controlled to greater than $10^9$ ohms per square. The polysilicon resistors can be made in the same single layer of polysilicon (gate and interconnect) by masking the polysilicon resistor regions from the high-impurity doping used in the gate and interconnect portions of the polysilicon layer. Additional area can be saved by using a second layer of polysilicon for the load resistors, and overlaying these resistors on the active area of the cell, as described in Sze, *VLSI Technology*, McGraw-Hill, pages 474-476 (1983).

However, such a dual polysilicon configuration, in which the two polysilicon layers are separated by chemically vapor deposited silicon dioxide, requires two extra masking steps, namely, the formation of an inter-poly contact that joins the load to the drain of the crosscoupled transistors and a poly load feature mask. In some applications, a third mask is used to define the load so that the second poly configuration can have both low resistance and high resistance at the same time. In this type of layout, the minimum length of the poly load will be critical. The load length cannot be too short, or else the load will be electrically shorted by lateral diffusion of the dopant from the highly doped, low resistance region into the lightly doped, high resistance region. The minimum poly load region depends on the process back-end temperature cycle; typically it is in the 4 to 6 micrometer region. A length shorter than this will impair the yield. Thus, scaling to the next generation of SRAMs will be limited by the ability of making short length poly resistors.

Additional problems that occur with prior art fabrication of SRAMs is that the dual poly structure results in poor step coverage. Further, the aspect ratio (step height divided by aperture size) of the contacts is poor. Due to the fact that dual poly is employed with the required isolation between the two poly layers and metal, the step height of a typical metal contact will be at least 0.8 to 1.5 micrometers, depending on the process to delineate the topology. With a typical contact aperture of about 1.2 micrometers for the state of the art contact opening, the aspect ratio will be about 1. The metal interconnect will not be able to make a better than 50% step coverage (which is a requirement of certain military specifications).

Thus, it is clear that a process for fabricating a polysilicon resistor load in a SRAM which avoids most, if not all, the foregoing problems is required.

SUMMARY OF THE INVENTION

Accordingly, it is an object of the present invention to provide an improved configuration and process for fabricating a polysilicon resistor load in a static RAM.

It is another object of the present invention to provide such an improved configuration and process which requires no more process steps than required by prior art devices.

It is a further object of the present invention to provide a flat topology for metal interconnects, to avoid the step coverage problem associated with the dual polysilicon configuration.

It is yet another object of the present invention to minimize the layout constraint of a poly load for maximum memory cell efficiency that will allow further memory cell size miniaturization.

It is a still further object of the present invention to provide a scalable poly load that is unaffected by diffusion from one portion of the polysilicon to another.

Briefly, a static RAM cell is provided having source, gate and drain regions in a substrate and a resistor load of polysilicon in series with a drain region. A planarized dielectric structure formed over the substrate includes via openings to expose the source and drain regions. Low resistance material fills the via openings. For N+ and P+ contacts, either polysilicon interconnects, appropriately doped for low resistance contacts, or a metal such as aluminum may be used. Where the contact includes a resistor load, undoped polysilicon is employed. Thus, the prior art approach of providing doped and undoped regions along the same polysilicon interconnect is not utilized. Rather, the doped and undoped regions are physically separated. Consequently, the minimum length of the poly load is limited only by the ability to form via openings of small dimensions.

In forming the SRAM cell of the invention, following junction formation, a relatively thick layer of chemically vapor deposited (CVD) silicon dioxide or nitride is formed on the surface of the substrate. The wafer is planarized, and a layer of undoped CVD oxide or nitride is formed thereover. Contact holes are defined in the CVD layer and are anisotropically etched, employing conventional etchants to form the holes. The contacts will include the poly load, as well as the poly contacts and the source and drain contacts.

Polysilicon is deposited to fill up the contact holes. A CVD oxide or nitride is next formed, and all contact regions of a given polarity are opened up. The polysilicon in the regions of that polarity is doped with a dopant of the same polarity. The CVD oxide (or nitride) is removed and redeposited, with all contact regions of the opposite polarity exposed. The polysilicon in the regions of the opposite polarity is doped with a dopant of that polarity. The polysilicon in the load areas remains undoped.

The CVD oxide (or nitride) is removed and the polysilicon is blanket-etched to clear all non-contact, nonpoly load areas. The interconnect metallization is deposited and patterned. A barrier material may be deposited over the exposed polysilicon regions prior to depositing the metal thereover. The remainder of the processing is continued as in the prior art.

Alternatively, the contact holdes for the poly load contacts are formed, and undoped polysilicon is deposited to fill those contact holes. Excess polysilicon is removed from the CVD oxide or nitride surface. Next, all remaining contact holes are defined and anisotropically etched. A metal, such as aluminum, is deposited to fill up the contact holes. The interconnect metallization is formed as above and the processing is continued.

The SRAM structure of the invention and process for forming the same improves the topology over prior art approaches. Since the contact area is flat, there is no aspect ratio problem. Finally, no extra area is required for the poly load, since the poly load is vertical within the contact area.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is now made in detail to a specific embodiment of the present invention, which illustrates the best mode presently contemplated by the inventors for practicing the invention. Alternative embodiments are also briefly described as applicable.

Figure 1:
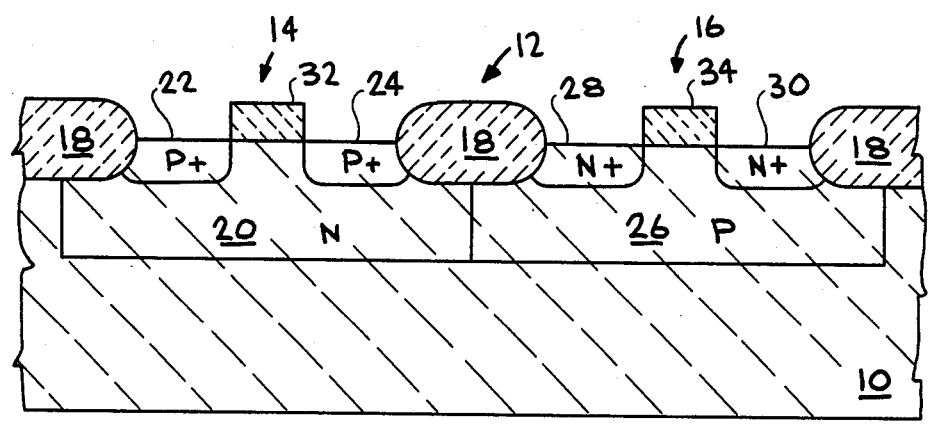
FIGS. 1-6 depict, in cross-section, the sequence of processing steps employed in the practice of the invention.

FIG. 1 depicts a portion of a wafer 10, preferably silicon, having formed therein a plurality of CMOS devices, one of which is depicted generally at 12, comprising NMOS and PMOS devices, 14 and 16, respectively.

While a CMOS device is used to illustrate the invention, it will be appreciated that the structure and process disclosed herein may be used in any of the semiconductor technologies used to fabricate SRAMs. Further, while a semiconductor wafer 10 of silicon is used to illustrate the invention, an epitaxial layer of semiconductor material could alternately be employed, and the nature of the substrate in such a case would be immaterial.

In any event, the silicon substrate in which the devices will be formed is lightly doped with n-type atoms, about $5 \times 10^{14}$ cm$^{-3}$, over which has been formed a dielectric layer 18, preferably silicon dioxide. The dielectric layer 18 is usually referred to as the field oxide and is typically formed to a thickness of about 4,000 to 9,000 Ångstroms (Å). Of course, p-type material could alternately be employed as the substrate 10.

As is conventional, openings are formed in the layer 18 by masking and etching to define n-channel and p-channel regions, in each of which will be formed source, drain and channel regions of the NMOS and PMOS devices 14 and 16, respectively. The regions are doped to provide an n-well 20, with its associated source (P+) 22 and drain (P+) 24 regions, and a p-well 26, with its associated source (N+) 28 and drain (N+) 30 regions. Gate oxide 32 is formed over the n-channel region 20 between the source 22 and drain 24 regions, while gate oxide 34 is formed over the p-channel region 26 between the source 28 and drain 30 regions. Conventional channel stop regions may be provided, if desired, to isolate the n- and p-channel regions from each other and from neighboring regions.

Figure 2:
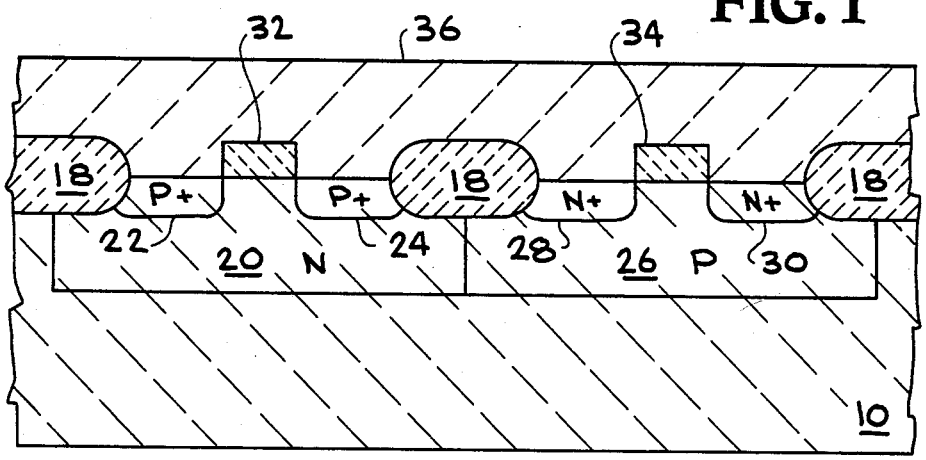

Next, following formation of the junctions above, a relatively thick layer of dielectric 36 is deposited for isolation. Preferably, silicon dioxide or silicon nitride, fromed by CVD to a thickness of about 1 to 2 micrometers, is employed. The CVD dielectric is planarized, employing methods well-known in the art. For example, a film of photoresist is spun onto the dielectric surface. The flat surface of the photoresist film is transferred to the dielectric layer 36 by over-etching the photoresist in a plasma under conditions such that the photoresist and dielectric etch at about the same rate. After stripping any remaining photoresist, an additional thin layer, about 0.3 to 0.5 micrometer, of dielectric (SiO$_2$ or Si$_3$N$_4$) is formed over the planarized dielectric layer 36. FIG. 2 depicts the processing stage following planarization of the CVD dielectric.

Contact holes or via openings 38, 40 and 42 are defined and anisotropically etched in the CVD layer 36 to expose portions of source 22, source 28 and drain 30. Reactive ion etching, using fluorine chemistry, is suitably employed in forming the contact holes. State of art contacts presently employ an opening of about 1.0 to 1.6 micrometers in the horizontal dimension. Contacts to drain 24 and gates 32 and 34 are not depicted, since such contacts do not form a part of this invention and to include them in the Figures would complicate the drawings.

Figure 3:
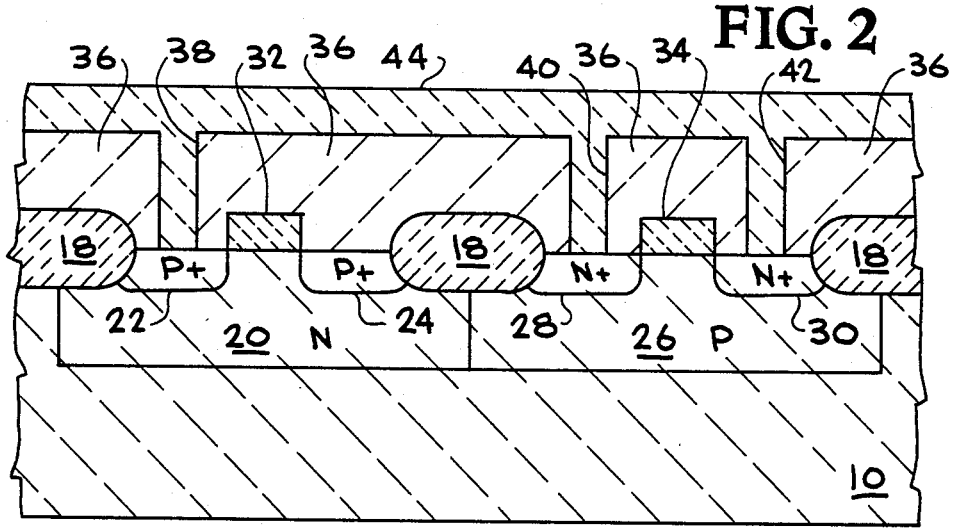

Polysilicon is deposited in the contact holes 38, 40, 42 by any of the conventional processes, such as low pressure CVD (LPCVD). The deposition is continued to form a thin layer 44 over the entire surface of the CVD layer 36. The polysilicon makes contact with the underlying surface of the substrate 10. The resulting structure is depicted in FIG. 3.

Figure 4:
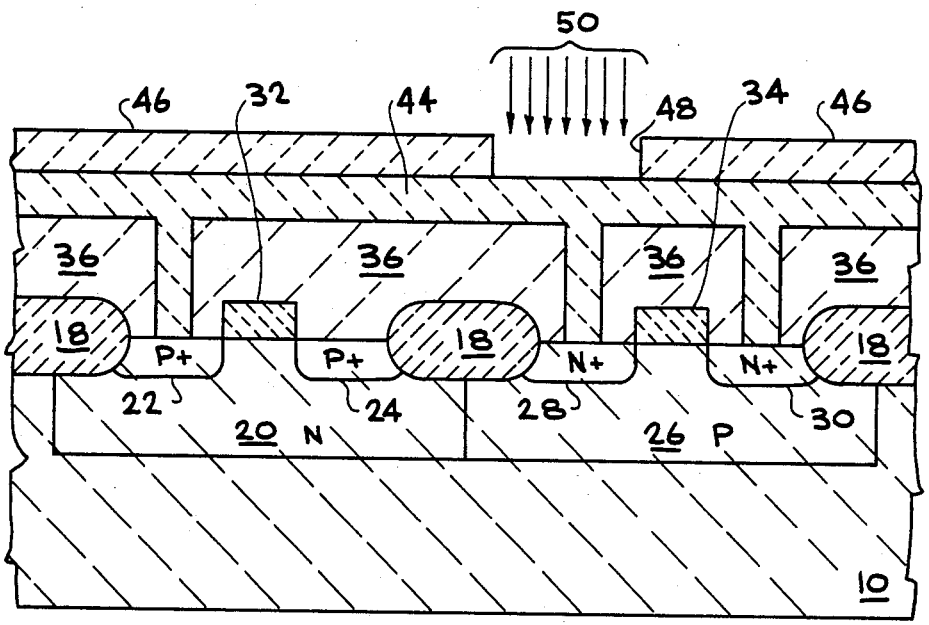

Next, a dielectric such as CVD oxide or nitride layer 46 is deposited over the entire surface of the polysilicon layer 44. All N+ contact regions are exposed by openings 48 in the dielectric layer 46. An n-type dopant, such as POCl$_3$, is diffused into the exposed regions, as shown by arrows 50. Alternately, ion implantation of a suitable ntype species, such as phosphorus, may be used to introduce the dopant. The patterning and definition by etching of the openings 48 is well-known and forms no part of this invention. FIG. 4 depicts the processing at this stage.

Subsequent to the doping operation, the wafer may be annealed at an elevated temperature (for example, 900° C. to 950° C.) for a period of time to achieve an acceptable resistance of about 100 ohms/$\mu$m$^2$ of contact area. Typically, an anneal of about ½ to 2 hours is adequate.

Figure 5:
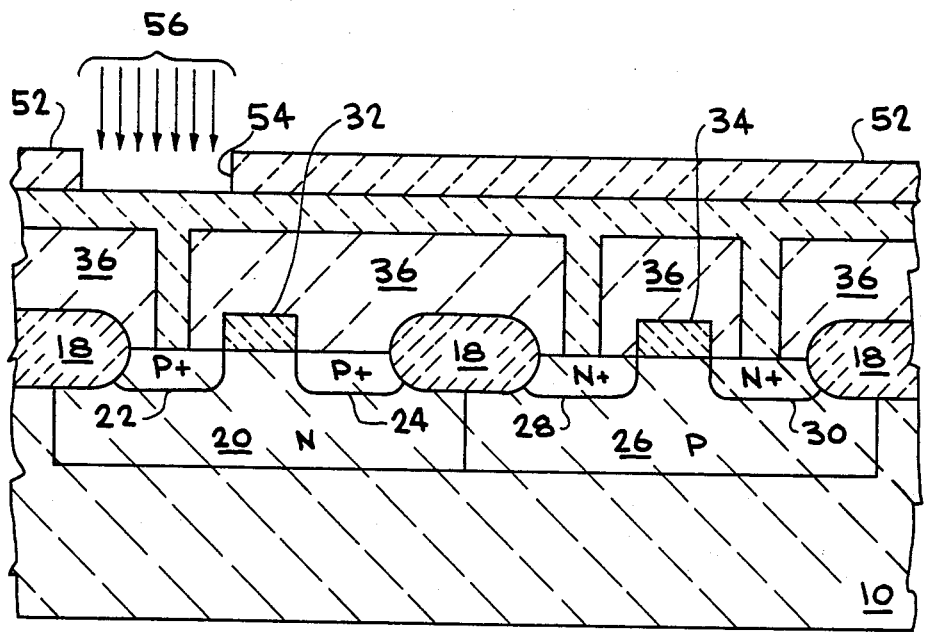

The dielectric layer 46 is removed, using well-known methods, and is replaced by a new dielectric layer 52, again CVD oxide or nitride, again covering the polysilicon layer 44. All P+ contact regions are exposed by openings 54 in the dielectric layer 52. A p-type dopant, such as BCl$_3$, is diffused into the exposed regions, as shown by arrows 56 in FIG. 5. The wafer is again annealed to achieve the desired contact resistance.

Figure 6:
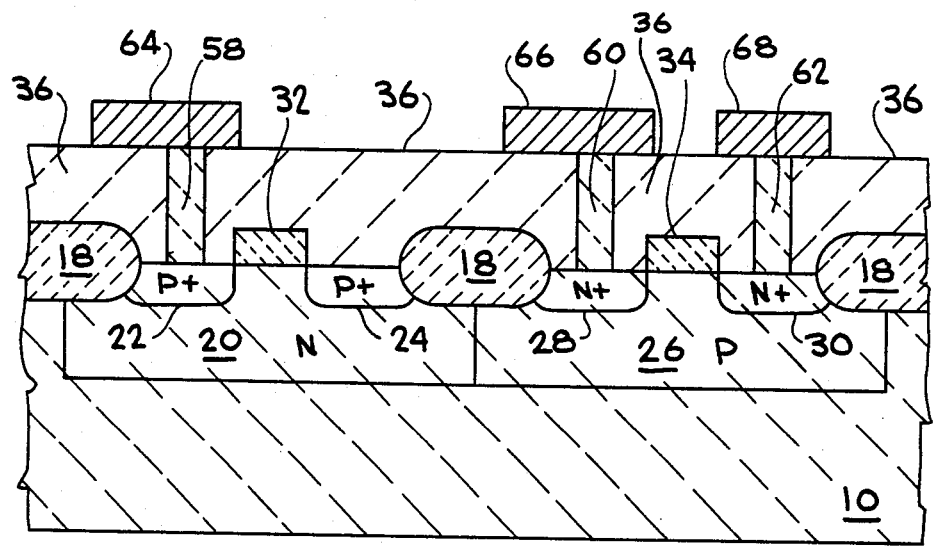

The dielectric layer 52 is removed, such as with a buffered chemical etchant, and the polysilicon layer is blanket etched, such as with an anisotropic, SF$_6$-type etchant, to remove all non-contact, nonpoly load areas, leaving behind N+ poly plug interconnect 58 to source 22, P+ poly plug interconnect 60 to source 28 and undoped poly plug interconnect 62 to drain 30, as shown in FIG. 6. Undoped interconnect 62 comprises the poly load, having a high resistivity (on the order of 10$^9$ to 10$^{11}$ ohms per square).

A metal layer is deposited and patterned, making individual ohmic contacts 64, 66, 68, respectively, with the interconnect plugs 58, 60 and 62, as shown in FIG. 6. To prevent interdiffusion between the polysilicon and the metal contact, a barrier material (not shown; about 500 to 2,000 Å), such as a refractory metal silicide/refractory metal nitride or a refractory metal/refractory metal nitride combination may be deposited prior to depositing the metal layer. Refractory metals utilized in such materials include molybdenum, tungsten, titanium and tantalum. Such a barrier material may also be employed prior to depositing the polysilicon, so as to isolate the semiconductor substrate from the polysilicon material. The metal employed in the metal layer is that conventionally employed in the art, such as aluminum. Alternatively, refractory metals and refractory metal silicides may be employed; the barrier layer would not be needed in such a case.

The processing of the wafer is continued as is conventional.

The process of the invention alternately contemplates the use of a metal, such as aluminum, for low resistance contact to all non-load areas. Accordingly, the processing steps described above in connection with depositing polysilicon into N+ and P+ contact openings and separately doping the polysilicon regions to obtain appropriate low resistance contacts are replaced by the following processing steps.

After deposition of the CVD dielectric layer 36, only the via opening 42 is defined. The via opening is formed by anisotropic etching to expose a portion of drain 30. Polysilicon 44 is deposited in the via opening 42. The sheet resistance of the polysilicon is controlled to about $10^9$ to $10^{11}$ ohms per square. The polysilicon is etched back to expose the CVD dielectric layer 36, leaving undoped interconnect 62 in the via opening 42.

Next, the via openings 38 and 40, which expose portions of source 22 and source 28, respectively, are defined by anisotropic etching, as above. Metal is then deposited to make ohmic contact with P+ source 22 and N+ source 28, thereby forming interconnect plugs 58 and 60, respectively. Yet another metal layer is then deposited and defined to form ohmic contacats 64, 66, 68, respectively, to interconnect plugs 58, 60 and 62, as above. The two layers of metal can be the same material. In such case, the two layers can be formed in the same deposition step.

The same barrier materials may be introduced prior to metal deposition, as above.

It will be appreciated that the flat topography provided herein eliminates the conventional poly load layer and aspect ration problem.

Finally, the process of fabricating SRAMs is simplified, with three critical alignment-sensitive masks being replaced by two non-critical and less alignment-sensitive masks in the process of the invention. With the physical separation of doped and undoped polysilicon interconnects, the effective poly load length is limited only by the dopant out-diffusion from the single crystalline drain region on one side and low temperature (typically less than 400° C.) metal out-diffusion (minimized by metal barrier) from the other side. Therefore, the poly load is scalable to smaller dimensions than in the prior art. By putting the poly load in the vertical direction, it eliminates the contraint in horizontal scaling imposed by prior art techniques.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for fabricating at least one static RAM cell on a substrate, comprising junction regions disposed in a major surface of said substrate and a load resistor electrically contacting one of said junction regions, said process including:
   (a) forming a planar dielectric layer on said major surface;
   (b) forming via openings in said dielectric layer to expose portions of said junction regions;
   (c) depositing undoped polysilicon in one of said via openings to form said load resistor in contact with said junction region and forming low resistance material interconnects in each of the remaining via openings to electrically contact the remaining junction regions; and
   (d) forming separate metal contacts to each of said polysilicon and said low resistance material interconnects.

2. The process of claim 1 wherein polysilicon is deposited in all said via openings and said polysilicon, other than said polysilicon comprising said load resistor, is doped to match the polarity of the junction region underlying each said via opening to thereby form said low resistance interconnects.

3. The process of claim 1 wherein polysilicon is deposited in one of said via openings to form said load resistor and a metal is deposited in all remaining via openings.

4. The process of claim 3 wherein said metal is selected from the group consisting of aluminum, refractory metals, and refractory metal silicides.

5. The process of claim 1 wherein a barrier layer is formed over at least one of the following regions: (a) said exposed junction regions prior to depositing said polysilicon and forming said low resistance material interconnects, and (b) said polysilicon prior to depositing said metal contacts.

6. The process of claim 5 wherein said barrier layer comprises a combination selected from the group consisting of a refractory metal silicide/refractory metal nitride and a refractory metal/refractory metal nitride.

7. A process for fabricating at least one static RAM cell on a substrate comprising junction regions disposed in a major surface of said substrate and a load resistor contacting one of said junction regions, said process including:
   (a) forming a planar dielectric layer on said major surface;
   (b) forming via openings in said dielectric layer to expose portions of said junction regions;
   (c) depositing polysilicon interconnects in said via openings;
   (d) doping said polysilicon to match the polarity of the junction region underlying each said aperture, other than said polysilicon comprising said load resistor; and (e) forming separate metal contacts to each said polysilicon interconnect.

8. The process of claim 7 wherein a barrier layer is formed over at least one of following regions: (a) said exposed junction regions prior to depositing said polysilicon interconnects and (b) said polysilicon interconnects prior to depositing said metal contacts.

9. The process of claim 8 wherein said barrier layer comprises a combination selected from the group consisting of a refractory metal silicide/refractory metal nitride and a refractory metal/refractory metal nitride.

10. A process for fabricating at least one static RAM cell, each comprising a pair of complementary metal-oxide semiconductor transistors formed in a major surface of substrate, each transistor defined by source, gate and drain regions, and a load resistor in series with a drain region, said process including:

(a) forming a planarized dielectric layer consisting essentially of a material selected from the group consisting of silicon dioxide and silicon nitride on said surface;

(b) forming via openings in said planarized layer to expose portions of said source and drain regions;

(c) depositing polysilicon interconnects in said via openings;

(d) doping said polysilicon to match the polarity of the junction region underlying each said aperture, other than said polysilicon comprising said load resistor; and (e) forming separate metal contacts to each said polysilicon interconnect.

11. The process of claim 10 wherein a barrier layer is formed over at least one of the following regions: (a) said exposed junction regions prior to depositing said polysilicon interconnects and (b) said polysilicon interconnects prior to depositing said metal contacts.

12. The process of claim 11 wherei said barrier layer comprises a combination selected from the group consisting of a refractory metal silicide/refractory metal nitride and a refractory metal/refractory metal nitride.

13. The process of claim 10 wherein said doping of said polysilicon is accomplished after said deposition of said polysilicon in said via openings by:

(a) forming a dielectric layer over the surface of said substrate, including said polysilicon in said via openings;

(b) exposing first portions of regions of polysilicon making contact to regions of a first conductivity in said substrate;

(c) driving a first dopant species into said exposed first portions of said polysilicon;

(d) removing said dielectric layer;

(e) forming a new dielectric layer over the surface of said substrate, including said polysilicon in said via openings;

(f) exposing second portions of regions of polysilicon making contact to regions of a second conductivity in said substrate; and (g) driving a second dopant species into said exposed second portions of said polysilicon.

14. The process of claim 13 wherein said dopant species are driven into said exposed portions by either diffusion or ion implantation of a dopant species source, followed by annealing for a time and temperature sufficient to achieve a resistance of about 100 ohms/$\mu m^2$.

* * * * *